United States Patent [19]

Tokumo et al.

[11] Patent Number: 4,952,884
[45] Date of Patent: Aug. 28, 1990

[54] PULSE WIDTH MODULATION AMPLIFIER CIRCUIT

[75] Inventors: Akio Tokumo; Masayuki Kato; Takeshi Sato; Tatsuzo Hasegawa, all of Saitama, Japan

[73] Assignee: Pioneer Electronic Corporation, Tokyo, Japan

[21] Appl. No.: 389,091

[22] Filed: Aug. 3, 1989

[30] Foreign Application Priority Data

Dec. 28, 1988 [JP] Japan .................. 63-328810

[51] Int. Cl.⁵ .................. H03F 3/38; H03F 3/217
[52] U.S. Cl. ...................... 330/10; 330/251
[58] Field of Search .......... 330/10, 207 A, 251; 332/108, 109, 112, 123

[56] References Cited

U.S. PATENT DOCUMENTS 3,995,178  11/1976  Gilbert .................. 332/116 X
4,337,438  6/1982  Guggenbühl et al. ............ 330/10

FOREIGN PATENT DOCUMENTS 2917916  12/1980  Fed. Rep. of Germany .
3112035  2/1982  Fed. Rep. of Germany .
3227296  8/1983  Fed. Rep. of Germany .
3403802  8/1984  Fed. Rep. of Germany .
3625464  8/1987  Fed. Rep. of Germany .
1474951  5/1977  United Kingdom .

OTHER PUBLICATIONS

JP 57 170606, Patent Abstracts of Japan, Jan. 19, 1983, vol. 7, No. 13.
De-Z: TDA7260: Treiber-IC für Klasse-D-Verstärker, Elektor, Apr. 1987, S. 71-73.

Primary Examiner—Steven Mottola
Attorney, Agent, or Firm—Sughrue, Mion, Zinn, Macpeak & Seas

[57] ABSTRACT

A pulse width modulation amplifier circuit pulse modulates a triangular carrier wave with an analog input, and the pulse width modulated signal is amplified and demodulated. To reduce radiated interference, the carrier is first frequency modulated by a random signal.

3 Claims, 1 Drawing Sheet

PULSE WIDTH MODULATION AMPLIFIER CIRCUIT

BACKGROUND OF THE INVENTION

The present invention relates to a pulse width modulation amplifier circuit, and particularly relates to a pulse width modulation amplifier circuit having a reduced degree of disturbance exerted onto other equipment by a high-frequency carrier signal to be modulated into a pulse width modulation signal with an input analog signal.

One type of pulse width modulation amplifier (PWM amplifier), is configured so that a high-frequency triangular wave carrier signal is modulated with an analog signal, for example, an audio signal or the like, so as to be converted into a pulse width modulation signal. The pulse width modulation signal is power-amplified and then demodulated by removing the carrier signal with a filter. The demodulated signal is applied to a load such as a speaker or the like. Recently, PWM amplifiers of this type have been used in mobile audio equipment or the like because of the excellent efficiency of PWM amplifiers in achieving power amplification.

FIG. 3 shows an example of a conventional PWM amplifier. The reference numeral 1 designates an input terminal for receiving an analog signal. The analog signal is applied to an inverted input terminal of a comparator 2. The high-frequency output of a triangular wave carrier oscillator 3, on the other hand, is applied to a non-inverted input terminal of the comparator 2, so that the carrier signal is modulated with the analog signal so as to be converted into a pulse width modulation signal. The pulse width modulation signal obtained from the comparator 2 is passed through a drive amplifier 4, and then amplified by a pulse amplifier (power amplifier) 5 consisting of MOS power FETs. After the carrier signal is eliminated from the amplified pulse width modulation signal through a filter circuit consisting of a choke coil 6 and a capacitor 7, the demodulated signal drives a speaker 9 or the like connected to an output terminal 8.

In the above configuration, a high-frequency signal having a frequency of about 200 KHz, for example, is used as a triangular wave carrier signal to be modulated with an input analog signal into a pulse width modulation signal. The carrier signal has a disadvantage in that it contains higher harmonic components, and the harmonic components as well as the fundamental wave of the carrier signal are radiated, thereby causing various disturbances to radio receivers or the like.

In order to reduce such disturbances, it has been proposed that the fundamental wave of about 200 KHz be frequency-modulated with a specific frequency, for example, of about 20 Hz, to thereby disperse the carrier signal energy to reduce the levels of the radiated fundamental wave and its harmonic components to a certain extent.

However, the result of such dispersal of carrier signal energy does not extinguish the high-frequency signal, but simply reduces it, and the disturbance to receivers still occurs, though to a reduced extent as compared to the case where no countermeasures are taken. A further problem is that the 20 Hz signal and its harmonic components are demodulated and reproduced.

SUMMARY OF THE INVENTION

The present invention has been accomplished in view of the foregoing problems and an object thereof is to provide a pulse width modulation amplifier circuit in which the energy of the carrier signal is dispersed, resulting in a lesser amount of disturbance to other equipment, and in which the disturbance due to a modulation signal for performing the energy dispersion is not a problem.

In order to attain the foregoing object, the carrier signal is subjected to frequency modulation (FM) with a random signal having no periodicity. As a result, the energy of the carrier signal and its harmonic components are dispersed to make it possible to reduce the degree of disturbance to other equipment. Further, even if the frequency modulation signal acts on AM receivers or the like to cause disturbance to them, the disturbance is hardly perceptible because the random signal has no periodicity.

DETAILED DESCRIPTION OF THE PREFERRED EMBODIMENTS

Figure 1:
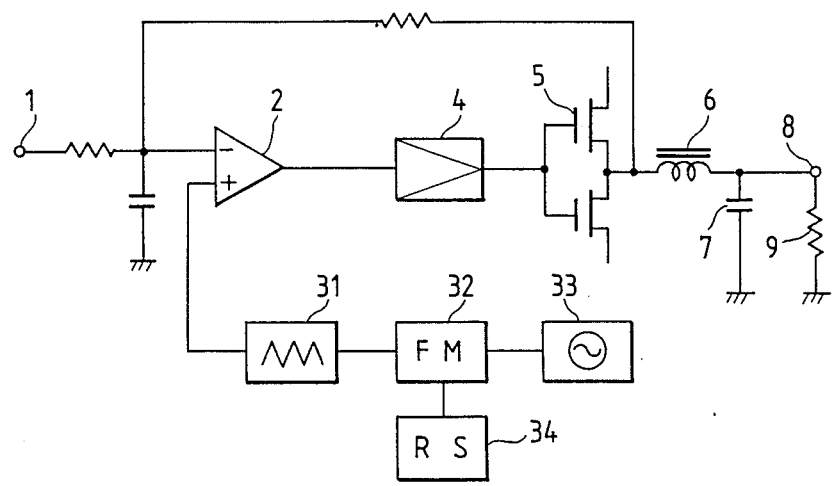
FIG. 1 is a block diagram showing an embodiment of the present invention.

An embodiment of the pulse width modulation amplifier circuit according to the present invention will be described hereunder with reference to FIG. 1, wherein parts designated by the reference numerals 1, 2, and 4 through 9 are the same as those correspondingly referenced in the conventional example of FIG. 3, and therefore the explanation of those parts is omitted.

Figure 3:
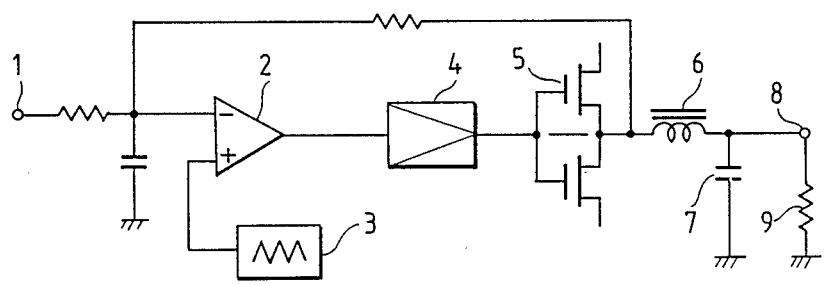
FIG. 3 is a block diagram showing a conventional PWM circuit.

The embodiment of FIG. 1 differs from the conventional example of FIG. 3 by the inclusion of elements 31 through 34.

Reference numeral 31 designates a triangular wave signal generator, which, for example, may include a capacitor that is charged with a fixed current from a constant-current regulated supply and discharged with the same fixed current so as to generate a triangular wave.

The reference numeral 32 designates a control circuit for sending a triggering control signal to the triangular wave signal generator 31 so as to cause the triangular wave signal generator 31 to initiate a charging and discharging cycle. The control circuit 32 is constituted by an FM modulation circuit which receives a fundamental signal, for example of about 200 Khz fed from a fundamental signal oscillator 33 and a random signal having no periodicity fed from a random signal oscillator 34.

The control circuit 32 frequency-modulates the fundamental signal of 200 KHz from the fundamental signal oscillator 33 with the random signal from the random signal oscillator 34 to obtain a modulation range of about ±20 KHz. As a result, the levels of the fundamental wave and its harmonic components of the resultant FM signal are as shown in FIG. 2.

In the drawing, $C_1$, $C_2$, and $C_3$ represent the spectra of the fundamental wave and its harmonic components before modulation, and $D_1$, $D_2$, and $D_3$ represent the fundamental wave and its harmonic components after spectrum dispersion by frequency modulation.

Figure 2:
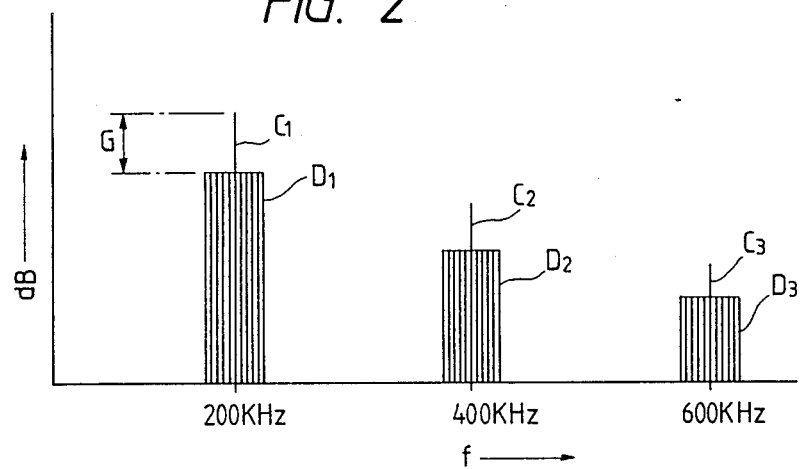
FIG. 2 is a characteristic diagram for explaining the operation of the embodiment of FIG. 1.

As seen from FIG. 2, the peaks of the fundamental wave and its harmonic components are reduced by the spectrum dispersion of about ±20 KHz, in comparison with the original signal levels, and the reduction G is about 10 dB.

As a result, spurious disturbance to radio receivers or the like can be reduced, and even if the random signal or its harmonic components are reproduced in the sound output of a radio receiver or the like for some reasons or other, spurious disturbance is hardly perceptible because the random signal has no periodicity.

As seen from the foregoing explanation, in the pulse width modulation amplifier circuit according to the present invention, a carrier signal to be modulated with an input analog signal into a pulse width modulation signal is frequency-modulated with a random signal having no periodicity. Therefore, the carrier signal and its harmonic components are subject to energy dispersion to thereby reduce peak levels thereof, so that spurious disturbance to radio receivers or the like can be reduced.

Further, since a random signal having no periodicity is used as the signal for performing frequency modulation, even if the FM signal affects radio receivers or the like, the disturbance will be hardly perceptible.

Although the random signal is used as the signal for frequency-modulating a carrier signal in the foregoing embodiment, the same effects as described above can be obtained also when so-called white noise or pink noise is used in place of the random signal.

What is claimed:

1. In a pulse width modulation amplifier circuit of the type having a carrier frequency generator providing a carrier wave that is pulse width modulated in a pulse width modulator by an input signal, and the pulse width modulated carrier is subsequently amplified and demodulated, the improvement comprising;
    means for frequency modulating said carrier wave with a random signal prior to said carrier wave being applied to said pulse width modulator.

2. The invention of claim 1, wherein said means comprises,
    a triangular wave generator for generating a triangular wave output having a frequency dependent upon the frequency of an input triggering signal,
    an oscillator for providing an oscillator output frequency signal,
    a random signal source for providing a random frequency signal,
    an frequency modulator for frequency modulating said oscillator output frequency signal with said random frequency signal and,
    said frequency modulator output being connected to said triangular wave generator as said triggering signal.

3. The invention of claims 1 or 2, wherein said random signal is a noise signal.

* * * * *